United States Patent
Lee et al.

(10) Patent No.: US 7,915,607 B2
(45) Date of Patent: Mar. 29, 2011

(54) NITRIDE SEMICONDUCTOR DEVICE

(75) Inventors: Seong Suk Lee, Gyunggi-do (KR); Hee Seok Park, Gyunggi-do (KR); Jae Woong Han, Seoul (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 88 days.

(21) Appl. No.: 12/403,728

(22) Filed: Mar. 13, 2009

(65) Prior Publication Data

US 2010/0080257 A1  Apr. 1, 2010

(30) Foreign Application Priority Data

Oct. 1, 2008  (KR) .................... 10-2008-0096762

(51) Int. Cl.
*H01L 29/06* (2006.01)
*H01S 5/00* (2006.01)

(52) U.S. Cl. ............... 257/14; 257/E33.03; 372/45.012

(58) Field of Classification Search .............. 257/14, 257/E21.089, E21.292, E33.001, E33.03; 372/45.012, 45.01, 43.01
See application file for complete search history.

(56) References Cited

U.S. PATENT DOCUMENTS

| 6,420,733 | B2 * | 7/2002 | Koide et al. ............ 257/79 |
| 6,744,064 | B2 * | 6/2004 | Lee et al. .............. 257/13 |
| 2005/0199892 | A1 * | 9/2005 | Cho et al. .............. 257/87 |
| 2006/0006375 | A1 | 1/2006 | Ou et al. |
| 2006/0086932 | A1 * | 4/2006 | Kim et al. ............. 257/13 |
| 2006/0108528 | A1 * | 5/2006 | Qiu .................. 250/338.4 |

FOREIGN PATENT DOCUMENTS

KR  10-2008-0035865 A  4/2008

* cited by examiner

*Primary Examiner* — Thomas L Dickey
*Assistant Examiner* — Nikolay Yushin
(74) *Attorney, Agent, or Firm* — McDermott Will & Emery LLP (57) ABSTRACT

A nitride semiconductor device include an n-type nitride semiconductor layer; a p-type nitride semiconductor layer; and an active layer formed between the n-type and p-type nitride semiconductor layers. The active layer has an alternately-layered structure of a plurality of quantum well layers and a plurality of quantum barrier layers, each alternately stacked on each of the quantum well layers. The alternately-layered structure includes a unit multi-layer structure and a thick quantum barrier well. The unit multi-layer structure includes a first quantum well layer, a second quantum well layer formed, a tunneling quantum barrier layer and a crystal quality-improving layer. The thick quantum barrier well may be formed adjacent to the first and second quantum well layers, with a thickness thereof greater than that of the first and second quantum well layers.

20 Claims, 7 Drawing Sheets

FIG. 1
PRIOR ART

PRIOR ART

FIG. 2A

PRIOR ART

NITRIDE SEMICONDUCTOR DEVICE

CROSS-REFERENCE TO RELATED APPLICATIONS

This application claims under 35 U.S.C. §119 (a) the benefit of Korean Patent Application No. 2008-0096762 filed on Oct. 1, 2008, in the Korean Intellectual Property Office, the disclosure of which is incorporated herein by reference in its entirety.

BACKGROUND OF THE INVENTION

1. Field of the Invention

The present invention relates to a nitride semiconductor device, more particularly, in which an active layer having an optimized structure of quantum barrier and well layers improves luminescence efficiency particularly in the case of high power operation.

2. Description of the Related Art

In general, nitride semiconductor devices, such as green or blue Light-Emitting Diodes (LEDs) and Laser Diodes (LDs), are widely used as a light source of full color displays, image scanners, various signal systems and optical communication devices. The nitride semiconductor devices can be provided as luminous devices that emit various colors of light such as green and blue light using an active layer based on electron-hole recombination.

After the development of the LEDs, a number of technical advancements have been achieved and widened their application fields. Accordingly, the LEDs are under study as general lighting devices and electronic devices. In particular, while conventional nitride light-emitting devices have been generally used as parts, which are applied to mobile products requiring low current and low power operation, the application fields are recently expanding into the fields requiring high current and high power operation. Accordingly, development of an LED structure having a high efficiency at high current operation is urgently demanded.

Figure 1:
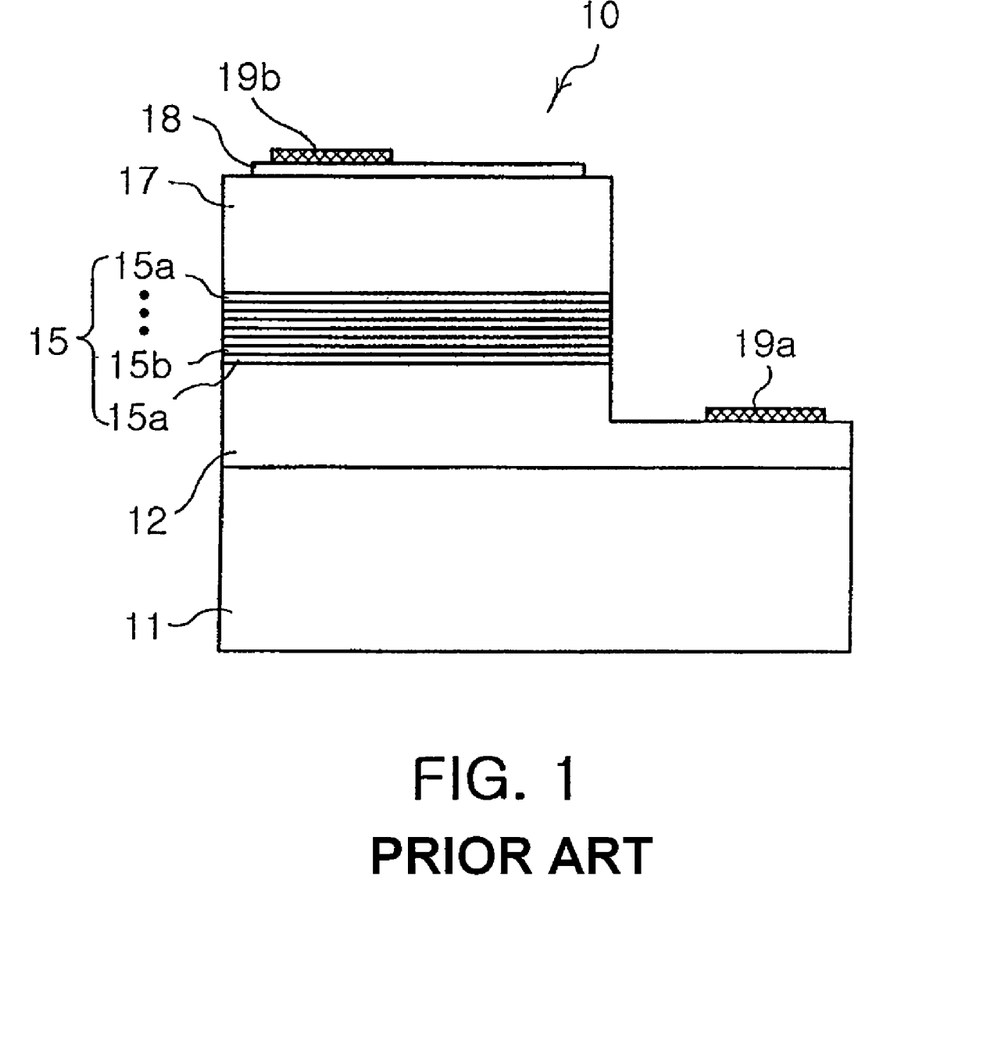
FIG. 1 is a cross-sectional view illustrating a typical nitride semiconductor device.

FIG. 1 is a cross-sectional view illustrating a typical nitride semiconductor device.

Referring to FIG. 1, a nitride semiconductor device 10 includes an n-type nitride semiconductor layer 12, an active layer 15 having a multiple quantum well structure, a p-type nitride semiconductor layer 17 and a transparent electrode layer 18, formed sequentially on a sapphire substrate 11. A portion of the n-type nitride semiconductor layer 12 is etched to provide an area on which an n-type electrode 19a is formed, and a p-type electrode 19b is formed on the transparent electrode layer 18. The active layer 15 has a multiple quantum well structure consisting of a plurality of quantum well layers 15a and a plurality of quantum barrier layers 15b, which are alternately stacked on each other.

The luminescence efficiency of the nitride semiconductor device is generally determined by internal quantum efficiency, the probability of electron-hole recombination in the active layer. Attempts to improve the internal quantum efficiency are subjected to researches, generally for the purpose of increasing the number of effective carriers participating in light emission by improving the structure of the active layer. In other words, it is required to decrease the number of effective carriers overflowed from the active layer in order to increase the number of effective carriers in the active layer.

In addition, since carriers can be injected to only a specific local area of the active layer, the effective light-emitting area in the entire active layer is limited. Since this limitation of the effective light-emitting area is directly connected with degradation in luminous efficiency, an attempt capable of ensuring electron-hole recombination in the entire active area is demanded. This will be described in more detail with reference to FIGS. 2A and 2B.

Figure 2A:
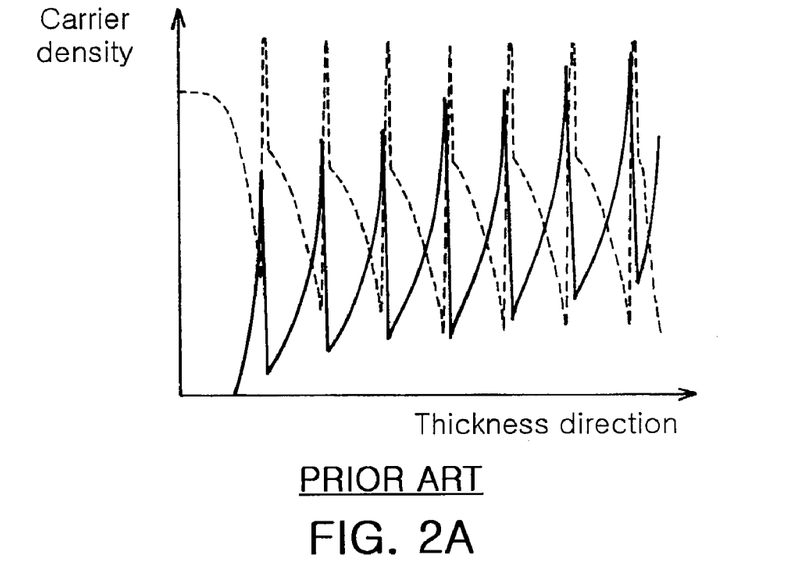
FIGS. 2A and 2B are graphs of simulation results illustrating the distribution of a carrier wave function and an effective active area with respect to active layers in which seven pairs of quantum well layers and quantum barrier layers are formed with thicknesses 30 and 150 Å, respectively, as examples of a conventional nitride semiconductor device.
Figure 2B:
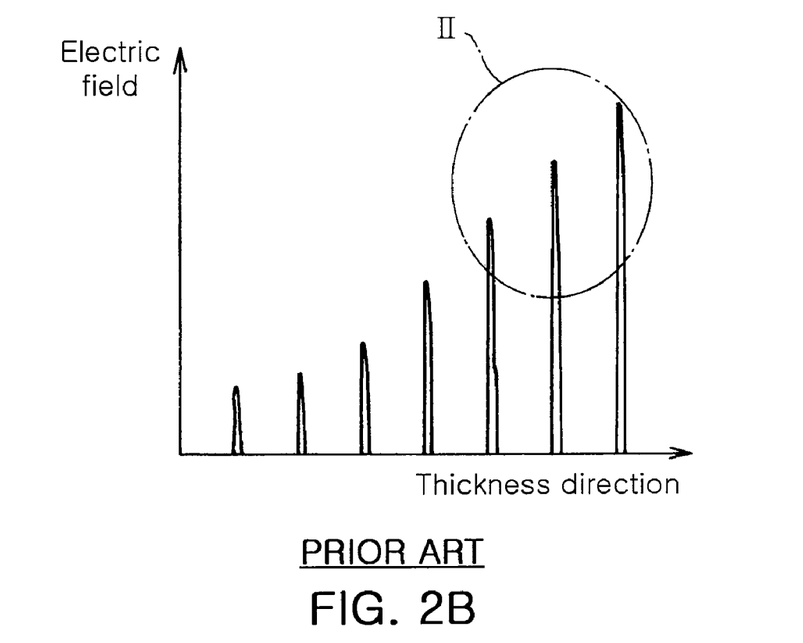

FIGS. 2A and 2B are graphs of simulation results illustrating the distribution of a carrier wave function and an effective active area with respect to active layers, in which seven pairs of quantum well layers and quantum barrier layers are formed with thicknesses 30 and 150 Å, respectively, as examples of a conventional nitride semiconductor device.

Firstly, referring to the wave function (dotted line: electrons, solid line: holes) shown in FIG. 2A, the probability of existence of the holes sharply decreases with the number of the pairs increasing since the holes are relatively less mobility than the electrons. While the distribution of the electrons and the holes decreases as the electrons and the holes are more remote from n-type and p-type nitride semiconductor layers, the number of the holes relatively more sharply decreases. Accordingly, as shown in FIG. 2B, effective recombination probability tends to be higher in a quantum well layer located in an area II, which is more adjacent to the p-type nitride semiconductor layer.

Such a problem of efficiency droop or reduction in the effective active area of the active layer is more prominent especially when the semiconductor device is used in a lighting device that requires high current operation. Accordingly, a multiple quantum well structure capable of improving luminous efficiency in high power operation is required in the art.

SUMMARY OF THE INVENTION

An aspect of the present invention provides a nitride semiconductor device, in which luminescence efficiency in the case of high power operation is greatly improved by an active layer having an optimized structure of quantum barrier and well layers.

According to an aspect of the present invention, the nitride semiconductor device may include an n-type nitride semiconductor layer; a p-type nitride semiconductor layer; and an active layer formed between the n-type and p-type nitride semiconductor layers, wherein the active layer has an alternately-layered structure of a plurality of quantum well layers and a plurality of quantum barrier layers, each alternately stacked on each of the quantum well layers. The alternately-layered structure of a plurality of quantum well layers and a plurality of quantum barrier layers may include a unit multi-layer structure and a thick quantum barrier well. The unit multi-layer structure may include a first quantum well layer, a second quantum well layer formed adjacent to the first quantum well layer at a position facing the p-type nitride semiconductor layer, the second quantum well layer having a quantum level higher than that of the first quantum well layer, a tunneling quantum barrier layer disposed between the first and second quantum well layers and a crystal quality-improving layer formed adjacent to the second quantum well layer at a position facing the p-nitride semiconductor layer. The crystal quality-improving layer may be a quantum barrier layer having a thickness greater than that of the tunneling quantum barrier layer. The thick quantum barrier well may be formed adjacent to the first and second quantum well layers, with a thickness thereof greater than that of the first and second quantum well layers.

In an exemplary embodiment of the present invention, the active layer may include at least two of the unit multi-layer structures, which are repeatedly stacked on each other. Here, the unit multi-layer structures are repeatedly stacked on each other 2 to 30 times. In addition, the thick quantum well layer is disposed between the unit multi-layer structures, forming an interface with a corresponding one of the tunneling quantum barrier wells of the unit multi-layer structures.

In another exemplary embodiment of the present invention, a part of the alternately-layered structure of a plurality of quantum well layers and a plurality of quantum barrier layers may have a super-lattice structure. Here, the super-lattice structure of the active layer may be disposed more adjacent to the n-type nitride semiconductor structure than the unit multi-layer structure is.

In addition, the quantum well layers and the quantum barrier layers included in the super-lattice structure may have a thickness ranging from 20 to 60 Å.

Furthermore, the super-lattice structure may include five to fifteen of the quantum well layers and five to fifteen of the quantum barrier layers.

In addition, the active layer may include one to five of the unit multi-layer structures.

In a further exemplary embodiment of the present invention, the thick quantum well layer may be formed between the super-lattice structure and the unit multi-layer structure. Here, the thick quantum well layer of the active layer may be formed to be more adjacent to the p-type nitride semiconductor layer than to the n-type nitride semiconductor layer.

In addition, the quantum barrier layer formed between the thick quantum barrier well layer and the first quantum well layer of the unit multi-layer structure adjacent to the thick quantum barrier well layer may have a thickness ranging from 20 to 60 Å.

In an exemplary embodiment of the present invention, the second quantum well layer may have a thickness smaller than the first quantum well layer.

In another exemplary embodiment of the present invention, the first quantum well layer may have a thickness ranging from 20 to 60 Å.

In a further exemplary embodiment of the present invention, the second quantum well layer may have a thickness ranging from 10 to 50 Å.

In a further another exemplary embodiment of the present invention, the tunneling quantum barrier layer may have a thickness ranging from 10 to 80 Å.

In another exemplary embodiment of the present invention, the crystal quality-improving layer may have a thickness ranging from 30 to 200 Å.

In a further exemplary embodiment of the present invention, the thick quantum well layer may have a thickness ranging from 50 to 100 Å.

In a further another exemplary embodiment of the present invention, the quantum level of the second quantum well layer may be realized by doping.

In another exemplary embodiment of the present invention, the unit multi-layer structure may further include a third quantum well layer formed adjacent to the first quantum well layer in a position facing the n-type nitride semiconductor layer, the third quantum well layer having a quantum level higher than that of the first quantum well layer; and a second tunneling quantum well layer formed between the first and third quantum well layers, with a thickness thereof allowing carriers to pass through via tunneling. Here, the third quantum well layer may have a thickness ranging from 10 to 50 Å, and the second tunneling quantum barrier layer may have a thickness ranging from 10 to 80 Å.

As set forth above, embodiments of the present invention can provide a nitride semiconductor device in which luminescence efficiency in high power operation is greatly improved by an active layer having an optimized structure of quantum barrier and well layers.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

The present invention will now be described hereinafter more fully with reference to the accompanying drawings, in which exemplary embodiments thereof are shown.

The present invention may however be embodied in many different forms and should not be construed as limited to the embodiments set forth herein. Rather, these embodiments are provided so that this disclosure will be thorough and complete, and will fully convey the scope of the present invention to those skilled in the art. In the drawings, the thickness, shapes and dimensions may be exaggerated for clarity and the same reference numerals are used throughout to designate the same parts.

Figure 3:
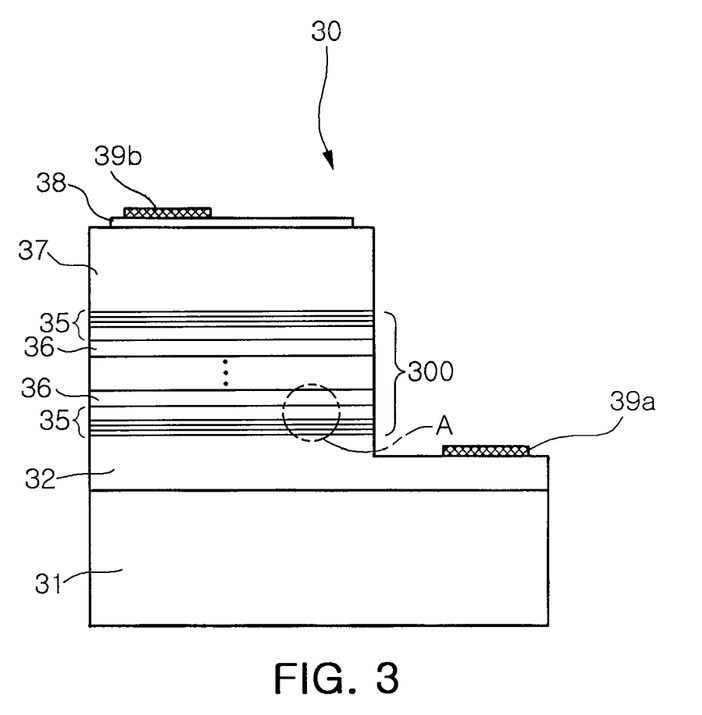
FIG. 3 is a cross-sectional view illustrating a nitride semiconductor device according to an exemplary embodiment of the present invention.
Figure 4:
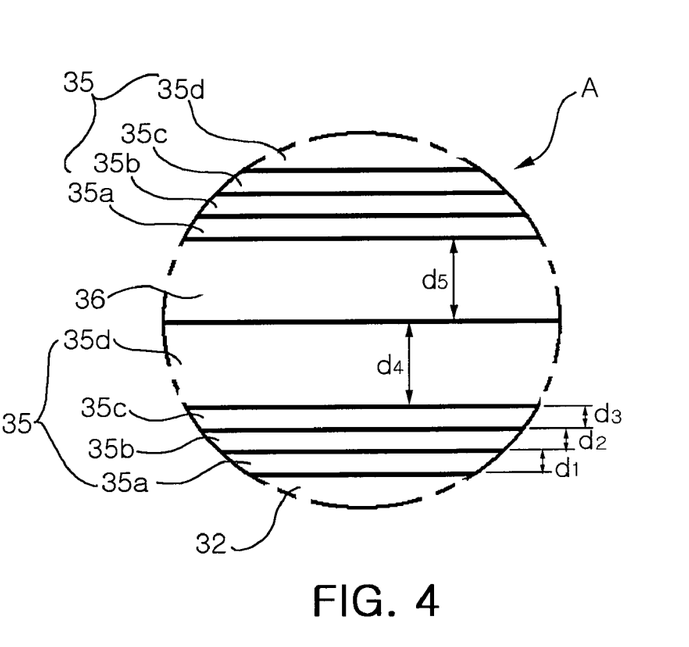
FIG. 4 is an enlargement of the area A in FIG. 3.

FIG. 3 is a cross-sectional view illustrating a nitride semiconductor device according to an exemplary embodiment of the present invention, and FIG. 4 is an enlargement of the area A in FIG. 3.

Firstly, referring to FIG. 3, a nitride semiconductor device 30 includes a substrate 31, an n-type nitride semiconductor layer 32, an active layer 300 and a p-type nitride semiconductor layer 37. An n-type electrode 39a can be formed on a predetermined portion of the n-type nitride semiconductor layer 32, which is not covered with the active layer 300. In addition, a transparent electrode layer 38 and a p-type electrode 39b can be formed sequentially on the p-type nitride semiconductor layer 37. As an alternative, the transparent electrode layer 38 can be excluded. Although the nitride semiconductor device according to this embodiment is illustrated as having a horizontal structure in which the n-type and p-type electrodes 39a and 39b are oriented in the same direction, this is not intended to be limiting. Rather, it will be apparent to those skilled in the art that the present invention is also applicable to a nitride semiconductor device having a vertical structure.

The substrate 31 is provided as a growth substrate for nitride single crystal, and can generally be implemented with a sapphire substrate. The sapphire substrate is made of a crystal having Hexa-Rhombo R3c symmetry, in which lattice constants in c-axis and a-axis directions are 13.001 and 4.758 Å, respectively. Lattice planes of the sapphire substrate are a C-plane (0001), an A-plane (1120), an R-plane (1102) and so on. The sapphire substrate is frequently used as a substrate for nitride semiconductor growth since the sapphire is stable at high temperature and it is relatively easy to grow a nitride film on the C-plane of the sapphire substrate. Of course, substrates made of other materials such as SiC, GaN, ZnO, $MgAl_2O_4$, MgO, $LiAlO_2$ and $LiGaO_2$ can also be used for instances. Furthermore, a buffer layer such as an undoped GaN layer can also be grown in order to improve the crystal quality of nitride semiconductor single crystal, which is grown on the substrate 31.

The n-type nitride semiconductor layer 32 can be made of a semiconductor material having the composition $Al_xIn_yGa_{(1-x-y)}N$ ($0 \leq x \leq 1$, $0 \leq y \leq 1$ and $0 \leq x+y \leq 1$), to which n-type type dopant is doped, and the p-type nitride semiconductor layer 37 can also be made of a semiconductor material having the composition $Al_xIn_yGa_{(1-x-y)}N$, to which p-type dopant is doped. The representative examples of the semiconductor material may include GaN, AlGaN and InGaN. Available examples of the n-type dopant may include Si, Ge, Se, Te and the like, and available examples of the p-type dopant may include Mg, Zn, Be and the like.

The active layer 300 formed between the n-type and p-type nitride semiconductor layers 32 and 37 emits a predetermined energy of light through electrons-hole recombination. As shown in FIG. 3, the active layer 300 has a multiple quantum well structure consisting of a plurality of quantum well layers and a plurality of quantum barrier layers, which are alternately stacked on each other. Especially, in this embodiment, a unit multi-layer structure 35, which has total four layers consisting of two quantum well layers and two quantum barrier layers, is repeated one or more times. The unit multi-layer structure 35 is provided to facilitate migration of carriers in the active layer. In addition, a thick quantum well layer 36 for reducing auger recombination, non-radiative recombination of an electron and a hole, is formed adjacent to the unit multi-layer structure 35. In order to illustrate the unit multi-layer structure 35 and the thick quantum well structure 36 in more detail, the area indicated with "A" in FIG. 3 is enlarged in FIG. 4.

As shown in FIG. 4, the multiple quantum well structure according to this embodiment of the present invention includes a plurality of unit multi-layer structures 35, each of which has four layers consisting of two quantum well layers 35a and 35c and two quantum barrier layers 35b and 35d, and a plurality of thick quantum well layers 36, each of which is interposed between two adjacent ones of the unit multi-layer structures 35. Herein, considering the functions, the layers 35a, 35b, 35c and 35d of the unit multi-layer structures 35 will be referred to as a first quantum well layer 35a, as a tunneling quantum barrier layer 35b, as a second quantum well layer 35c, and as a crystal quality-improving layer 35d, respectively. The first quantum well layer 35a is a layer, which adjoins the n-type nitride semiconductor layer 32, and to which electrons from the n-type nitride semiconductor layer 32 are most preferentially injected. The first quantum well layer 35a acts as a main light-emitting layer in the unit multi-layer structure 35.

The second quantum well layer 35c has a quantum level higher than that of the first quantum well layer 35a. For this, in this embodiment, the thickness $d_3$ of the second quantum well layer 35c is smaller than the thickness $d_1$ of the first quantum well layer 35a. As will be described later, the second quantum well layer 35c mainly acts as a ladder facilitating migration of carriers into an adjacent quantum well layer due to the high quantum level, but its light-emitting function is poor compared to the first quantum well layer 35a.

The crystal quality-improving layer 35d is a quantum barrier layer provided to prevent a problem related with deterioration in the crystal quality of the first quantum well layer 35a, the tunneling quantum barrier layer 35b and the second quantum well layer 35c, which are formed before the crystal quality-improving layer 35d with a thickness of about several tens Å. Specifically, in the multiple quantum well structure of this embodiment, the migration of carriers inside the active layer can be enhanced by the structural features of the first quantum well layer 35a, the tunneling quantum barrier layer 35b and the second quantum well layer 35c, and thereby the crystal quality-improving layer 35d as the adjacent quantum barrier layer can be grown with a relatively large thickness. Accordingly, the thickness $d_4$ of the crystal quality-improving layer 35d is determined to be greater than that of the tunneling quantum barrier layer 35b. However, details on a suitable thickness of the crystal quality-improving layer 35d are not limiting the present invention, but the thickness of the crystal quality-improving layer 35d can be properly adjusted in consideration of the thickness of the active layer 300 and blue shift, which will be described later.

The thick quantum well layer 36 is be formed adjacent to the unit multi-layer structure 35, with a thickness $d_5$ greater than that of the first and second quantum well layers 35a and 35c. Since the first and second quantum well layers 35a and 35c are relatively thin as described above, the density of carriers in the first and second quantum well layers 35a and 35c is relatively great, thereby increasing non-radiative recombination. In this embodiment, the thickness $d_5$ of the thick quantum well layer 36 is formed to be relatively great to decrease the density of carriers in order to prevent non-radiative recombination, thereby preventing efficiency droop due to the non-radiative recombination.

Figure 5:
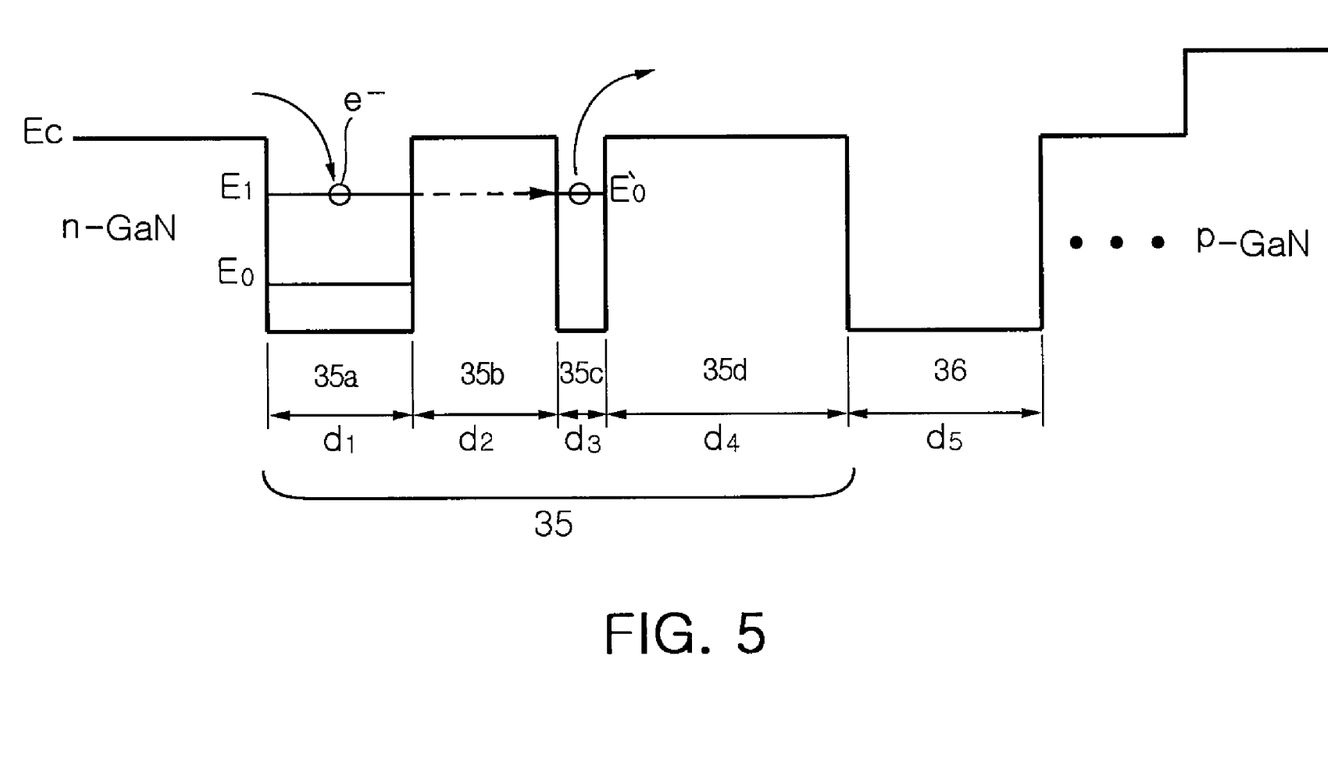
FIG. 5 is a diagram illustrating a conduction band energy level of the multiple quantum well structure shown in FIG. 4.

Below, with reference to FIG. 5, a more detailed description will be given of the functions of the unit multi-layer structure 35 and the thick quantum well layer 36. FIG. 5 is a diagram illustrating a conduction band energy level of the multiple quantum well structure shown in FIG. 4. In FIG. 5, only the migration of an electron as a carrier is illustrated for the sake of brevity. Firstly, a part of electrons e⁻ injected into the first quantum well layer 35a emits a predetermined wavelength of light via radiative recombination with holes. If a great amount of electrons are injected, electrons will fill up all energy levels $E_0$ and $E_1$ of the first quantum well layer 35a, with remaining electrons being tunnel-injected into the second quantum well layer 35c through the adjacent tunneling quantum barrier layer 35b. In this case, as will be described later, the second quantum well layer 35c has a quantum level higher than that of the first quantum well layer 35a so as to facilitate electron tunneling from the higher quantum level of the first quantum well layer 35a to the zero-energy quantum level $E'_0$ of the second quantum well layer 35c. The tunneling quantum barrier layer 35b has a thickness $d_2$ approximately in the range from 10 to 80 Å in order to perform the tunneling function. In addition, the thickness $d_1$ of the first quantum well layer 35a is in the range from 20 to 60 Å such that the first quantum well layer 35a has a high internal quantum efficiency due to a quantum effect.

Electrons injected into the second quantum well layer 35c via tunneling have a higher quantum level than those in the first quantum well layer 35a have. As described above, the second quantum well layer 35c can be understood as acting as a ladder that allows electrons to easily migrate into an adjacent quantum well layer, particularly, into the thick quantum well layer 36 or another first quantum well layer. The second quantum well layer 35c is preferably thinner than the first quantum well layer 35a in order to achieve such a high quantum level. Specifically, the thickness $d_3$ of the second quantum well layer 35c is approximately in the range from 10 to 50 Å. As such, the high quantum level of the second quantum well layer 35c can improve the efficiency of injection into an adjacent quantum well layer, thereby enlarging the entire effective light-emitting area of the active layer. In the meantime, the high quantum level of the second quantum well layer 35c can be realized not only by relatively decreasing the thickness but also for example by doping a suitable material or adjusting the content of indium (In) or aluminum (Al).

The crystal quality-improving layer 35d can be more advantageous in terms of electron injection into an adjacent quantum well layer when it is thin, for example, when its thickness is similar to that of the first quantum well layer 35a, the tunneling quantum barrier layer 35b and the second quantum well layer 35c. However, this embodiment is more focused to improvement in crystal quality. In greater detail, the first quantum well layer 35a, the tunneling quantum barrier layer 35b and the second quantum well layer 35c do not have excellent crystal quality since they are formed relatively thin to perform their functions. When these thin layers are repeatedly stacked on each other, entire improvement in luminous efficiency may be insignificant due to degradation in crystal quality even if carrier injection efficiency is improved. Hence, the crystal quality-improving layer 35d is preferably thicker than the previously formed layers 35a, 35b and 35c. However, the thickness $d_4$ of the crystal quality-improving layer 35d is approximately in the range from 30 to 200 Å considering that an increasing amount of injected current may cause a severe blue shift in the wavelength of emitted light if the crystal quality-improving layer 35d is too thick.

In addition, according to the characterizing features of the multiple quantum well structure of this embodiment, one unit multi-layer structure 35 is formed with the first quantum well layer 35a, the tunneling quantum barrier layer 35b, the second quantum well layer 35c and the crystal quality-improving layer 35d, and a plurality of such unit multi-layer structures 35 are repeated a plurality of times. Accordingly, both the mobility of carriers between the quantum well layers and the quality of semiconductor crystal can be improved, and especially in high power operation, excellent improvement in luminous efficiency can be obtained. In this case, the active layer 300 can include therein only one unit multi-layer structure 35 or a plurality of unit multi-layer structures 35, which are repeatedly stacked on each other. Optimum numbers of the repeatedly-stacked unit multi-layer structures 35 can be varied according to the amount of current density for actuating the device, and generally increase with the current density rising. When the unit multi-layer structure 35 is repeated a plurality of times, the unit multi-layer structure 35 is repeated preferably 30 times or less, in which neither the number of the quantum well layers nor the number of the quantum barrier layers exceeds 60. In contrast, as will be described later with respect to an exemplary embodiment shown in FIG. 7, the number of repeating the unit multi-layer structure may decrease when the unit multi-layer structure coexists with the super-lattice structure.

In the meantime, as described above, the thick quantum well layer 36, which contributes to improvement in luminous efficiency by suppressing non-radiative recombination, is required to have a sufficient amount of thickness in order to lower carrier density. Particularly, the thickness $d_5$ thereof is approximately in the range from 50 to 100 Å.

Figure 6:
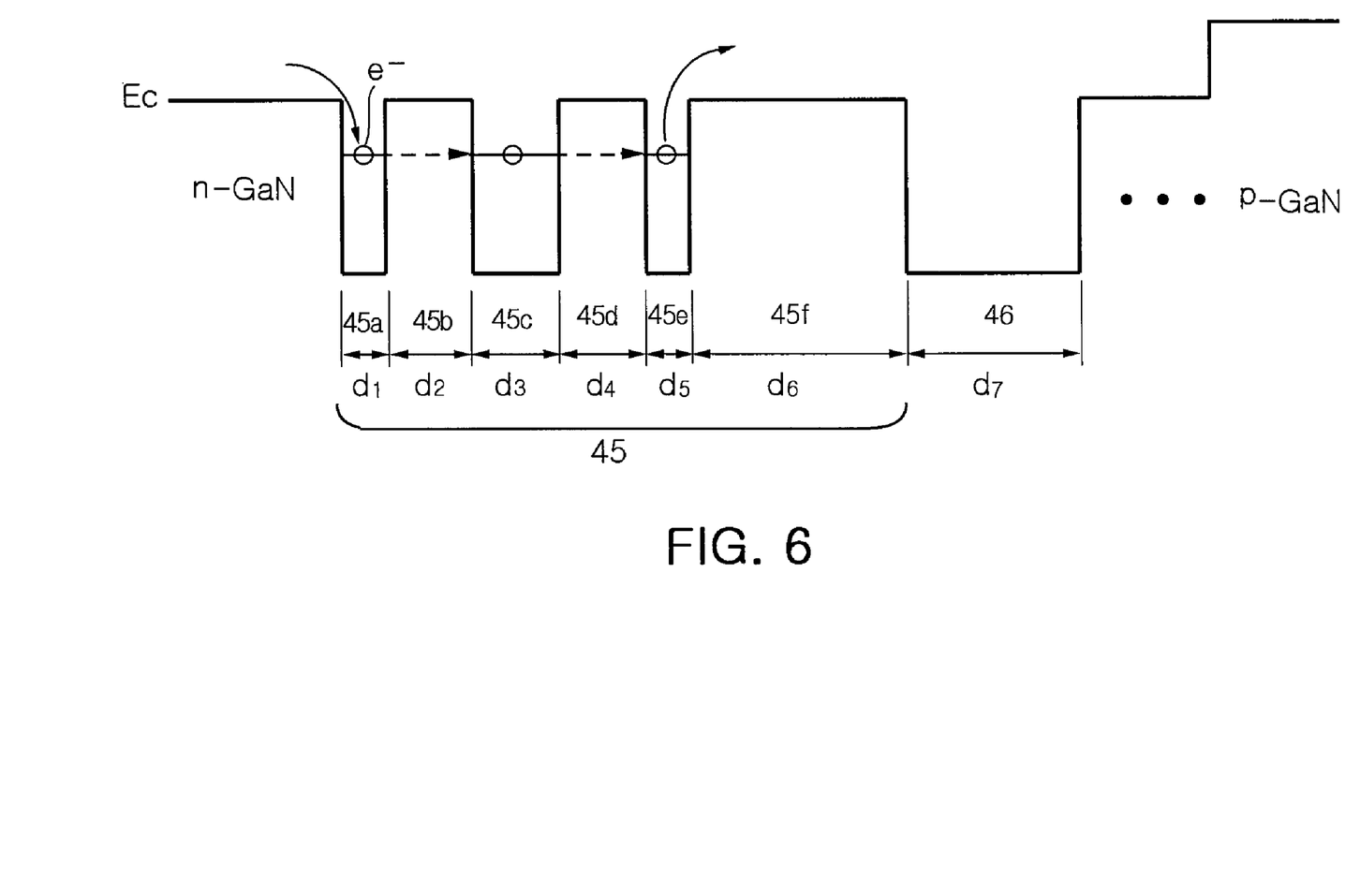
FIG. 6 is a diagram illustrating a conduction band energy level of a multiple quantum well structure adopted in a nitride semiconductor device according to another embodiment of the present invention.

FIG. 6 is a diagram illustrating a conduction band energy level of a multiple quantum well structure adopted in a nitride semiconductor device according to another embodiment of the present invention. In this embodiment, the unit multi-layer structure of the multiple quantum well structure corresponds to a structure similar to that of the foregoing embodiment, except for two more layers added thereto. As shown in FIG. 6, the unit multi-layer structure 45 of the multiple quantum well structure of this embodiment includes a first quantum well layer 45c, a first tunneling quantum barrier layer 45d, a second quantum well layer 45e and a crystal quality-improving layer 45f, which is similar to those shown in FIG. 5. In addition, the unit multi-layer structure 45 also includes a third quantum well layer 45a and a second tunneling quantum barrier layer 45b. Furthermore, a thick quantum well layer 46 is formed adjacent to the unit multi-layer structure 45.

This embodiment is configured in consideration of not only electron migration but also hole migration, in which the third quantum well layer 45a having a high quantum level is additionally placed on the path of holes such that the holes can be easily injected into an adjacent quantum well layer, and the second tunneling quantum barrier layer 45b is adopted for the same purpose as the first tunneling quantum barrier layer 45d. It can be understood that the third quantum well layer 45a and the second tunneling quantum barrier layer 45b correspond to the second quantum well layer 45e and the first tunneling quantum barrier layer 45d, respectively, even if the injection efficiencies of different carriers are intended to be improved. Therefore, the entire flow of carriers is similar to that in FIG. 5 except that electrons $e^-$ injected into the third quantum well layer 45a are in turn injected into the first quantum well layer 45c via tunneling. Accordingly, likewise the foregoing embodiment shown in FIG. 5, the first quantum well layer 45c acts as a main light-emitting layer in this embodiment. Detailed descriptions on the migration of carriers past the first quantum well layer 45c and on the functions of the respective layers will be omitted since they can be substituted with those on the foregoing embodiment.

Figure 7:
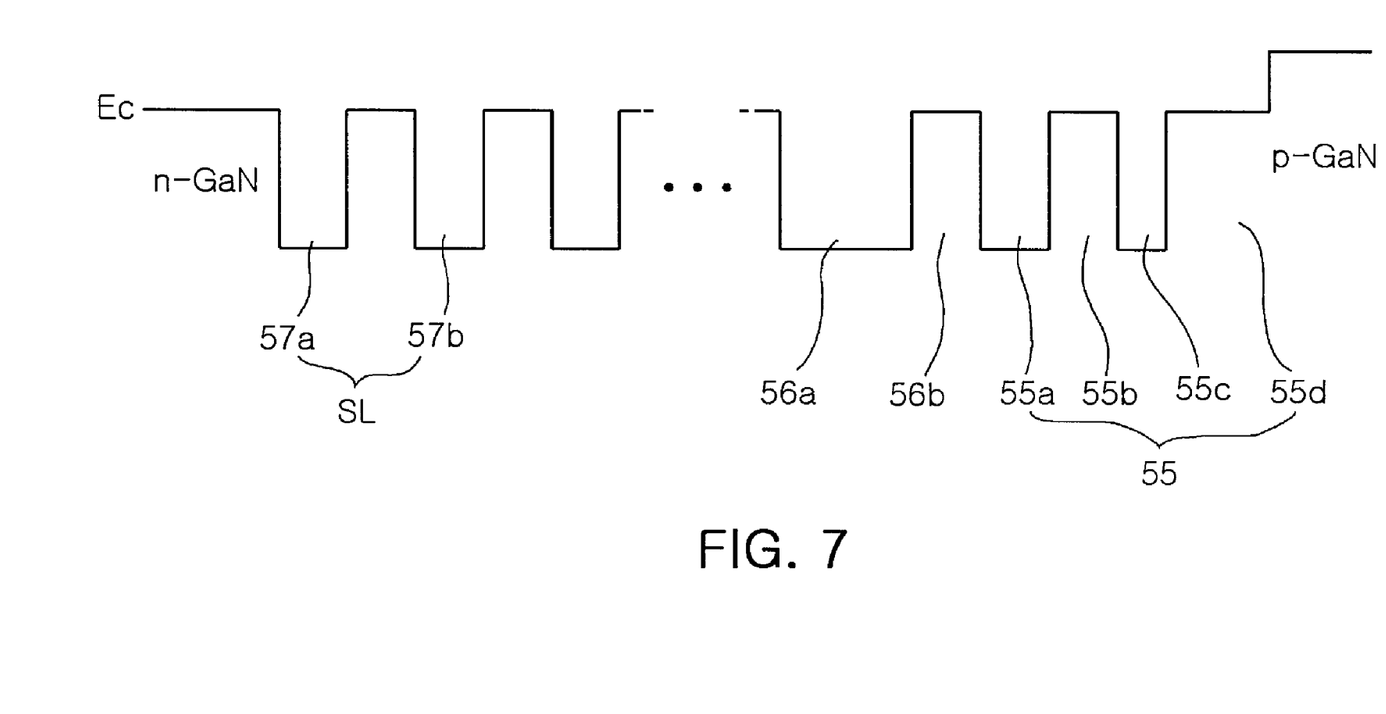
FIG. 7 is a diagram illustrating a conduction band energy level of a multiple quantum well structure adopted in a nitride semiconductor device according to a further embodiment of the present invention.

FIG. 7 is a diagram illustrating a conduction band energy level of a multiple quantum well structure adopted in a nitride semiconductor device according to a further embodiment of the present invention. In this embodiment, the active layer has a super-lattice structure as well as the unit multi-layer structure. As shown in FIG. 7, the super-lattice structure SL including a plurality of quantum well layers 57a and a plurality of quantum barrier layers 57b, which are alternately stacked on each other, is formed adjacent to the n-type nitride semiconductor layer (indicated with "n-type GaN" in the figure). In the super-lattice structure SL, the alternately-stacked structure of the quantum well layers 57a and the quantum barrier layers 57b is repeated 5 to 15 times, and the thickness of the quantum well layer 57a and of the quantum barrier layer 57b is approximately in the range from 20 to 60 Å. Accordingly, regarding the entire structure of the active layer, a thick quantum well layer 56a can be placed more adjacent to the p-type semiconductor layer (indicated with "p-type GaN" in the figure) than to the n-type semiconductor layer "n-type GaN."

A unit multi-layer structure 55 is formed adjacent to the p-type nitride semiconductor layer "p-type GaN," and includes a first quantum well layer 55a, a tunneling quantum barrier layer 55b, a second quantum well layer 55c and a crystal quality-improving layer 55d. The unit multi-layer structure 55 is configured the same as those described with respect to the foregoing embodiments, and can be repeated 1 to 5 times even if only one unit multi-layer structure 55 is shown in FIG. 7. A thick quantum well layer 56a is formed between the super-lattice structure SL and the unit multi-layer structure 55. In this case, a quantum barrier layer 56b formed between the thick quantum well layer 56a and the first quantum well layer 55a of the unit multi-layer structure 55 has a thickness in the range from 20 to 60 Å, which is similar to that of the first quantum well layer 55a. As set forth in this embodiment, since the super-lattice structure SL is adopted along with the unit multi-layer structure 55 and the thick quantum well layer 56a is placed between the super-lattice structure SL and the unit multi-layer structure 55 (particularly, to be more adjacent to the p-type nitride semiconductor layer), the migration of carriers can be more effectuated and non-radiative recombination can be reduced.

Figure 8:
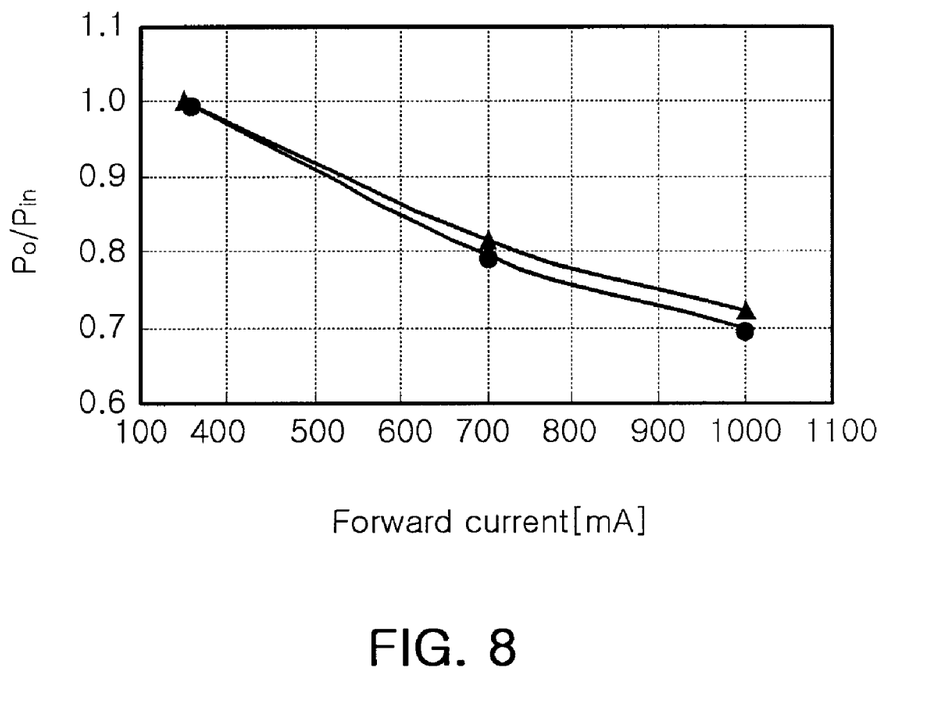
FIG. 8 is a graph illustrating energy conversion efficiencies with respect to supply currents in nitride semiconductor devices, which are manufactured according to an example of the present invention and a comparative example.

FIG. 8 is a graph illustrating energy conversion efficiencies with respect to supply currents in nitride semiconductor devices, which were manufactured according to an example of the present invention and a comparative example. The energy conversion efficiency is defined as a ratio of energy output $P_o$ to energy input $P_{in}$, and can be used as a measure to express luminous efficiency. In the case of the inventive example in FIG. 8 (marked with triangles), the multiple quantum well structure of the active layer has a structure as shown in FIG. 7, and the super-lattice structure was stacked 9 times with the quantum well layer and the quantum barrier layer having a thickness 30 Å. Thus, the super-lattice structure corresponded to a {30 Å/30 Å}×9 structure, and the unit multi-layer structure was a {30 Å/30 Å/20 Å/50 Å}×2 structure. The thick quantum well layer of the super-lattice structure and the quantum barrier layer of the unit multi-layer structure had a 50 Å/30 Å structure. In the case of the comparative example in FIG. 8 (marked with circles), a {30 Å/30 Å/20 Å/50 Å} structure corresponding to the unit multi-layer structure of the inventive example was stacked 7 times.

Referring to FIG. 8, with the quantity of current increasing, the inventive example had higher energy conversion efficiency than the comparative example had. This indicates that efficiency droop in response to high current injection was reduced. In this case, while the structure of the comparative example can decrease efficiency droop in high current operation compared to a conventional 30 Å/180 Å structure or a simple super-lattice structure, the structure of the inventive example further decreased efficiency droop. As set forth above, the active layer of the inventive example can provide relatively higher luminous efficiency in high current operation by using the thick quantum well layer, which suppresses non-radiative recombination, together with the unit multi-layer structure having four layers.

While the present invention has been shown and described with reference to certain exemplary embodiments thereof, it will be understood by those skilled in the art that various changes in form and details may be made therein without departing from the spirit and scope of the present invention as defined by the appended claims and their equivalents.

What is claimed is:

1. A nitride semiconductor device comprising:
an n-type nitride semiconductor layer;
a p-type nitride semiconductor layer; and
an active layer formed between the n-type and p-type nitride semiconductor layers, wherein the active layer has an alternately-layered structure of a plurality of quantum well layers and a plurality of quantum barrier layers, each alternately stacked on each of the quantum well layers,
wherein the alternately-layered structure of a plurality of quantum well layers and a plurality of quantum barrier layers comprises:
a plurality of unit multi-layer structure including a first quantum well layer, a second quantum well layer formed adjacent to the first quantum well layer at a position facing the p-type nitride semiconductor layer, the second quantum well layer having a quantum level higher than that of the first quantum well layer, a tunneling quantum barrier layer disposed between the first and second quantum well layers and a crystal quality-improving layer formed adjacent to the second quantum well layer at a position facing the p-nitride semiconductor layer, the crystal quality-improving layer comprising a quantum barrier layer having a thickness greater than that of the tunneling quantum barrier layer; and
a thick quantum well formed to be between the unit multi-layer structures, adjacent to the first and second quantum well layers, with a thickness thereof being greater than that of the first and second quantum well layers.

2. The nitride semiconductor device of claim 1, wherein the active layer comprises at least two of the unit multi-layer structures, which are repeatedly stacked on each other.

3. The nitride semiconductor device of claim 2, wherein the unit multi-layer structures are repeatedly stacked on each other 2 to 30 times.

4. The nitride semiconductor device of claim 2, wherein the thick quantum well layer is disposed between the unit multi-layer structures, forming an interface with a corresponding one of the tunneling quantum barrier wells of the unit multi-layer structures.

5. The nitride semiconductor device of claim 1, wherein a part of the alternately-layered structure of a plurality of quantum well layers and a plurality of quantum barrier layers comprises a super-lattice structure.

6. The nitride semiconductor device of claim 5, wherein the super-lattice structure of the active layer is disposed more adjacent to the n-type nitride semiconductor structure than the unit multi-layer structure is.

7. The nitride semiconductor device of claim 5, wherein the quantum well layers and the quantum barrier layers included in the super-lattice structure have a thickness ranging from 20 to 60 Å.

8. The nitride semiconductor device of claim 5, wherein the super-lattice structure includes five to fifteen of the quantum well layers and five to fifteen of the quantum barrier layers.

9. The nitride semiconductor device of claim 5, wherein the active layer comprises one to five of the unit multi-layer structures.

10. The nitride semiconductor device of claim 5, wherein the thick quantum well layer is formed between the super-lattice structure and the unit multi-layer structure.

11. The nitride semiconductor device of claim 10, wherein the thick quantum well layer of the active layer is formed to be more adjacent to the p-type nitride semiconductor layer than to the n-type nitride semiconductor layer.

12. The nitride semiconductor device of claim 10, wherein the quantum barrier layer formed between the thick quantum barrier well layer and the first quantum well layer of the unit multi-layer structure adjacent to the thick quantum barrier well layer has a thickness ranging from 20 to 60 Å.

13. The nitride semiconductor device of claim 1, wherein the second quantum well layer has a thickness smaller than the first quantum well layer.

14. The nitride semiconductor device of claim 1, wherein the first quantum well layer has a thickness ranging from 20 to 60 Å.

15. The nitride semiconductor device of claim 1, wherein the second quantum well layer has a thickness ranging from 10 to 50 Å.

16. The nitride semiconductor device of claim 1, wherein the tunneling quantum barrier layer has a thickness ranging from 10 to 80 Å.

17. The nitride semiconductor device of claim 1, wherein the crystal quality-improving layer has a thickness ranging from 30 to 200 Å.

18. The nitride semiconductor device of claim 1, wherein the thick quantum well layer has a thickness ranging from 50 to 100 Å.

19. The nitride semiconductor device of claim 1, wherein the quantum level of the second quantum well layer is realized by doping.

20. The nitride semiconductor device of claim 1, wherein the unit multi-layer structure further includes:
- a third quantum well layer formed adjacent to the first quantum well layer in a position facing the n-type nitride semiconductor layer, the third quantum well layer having a quantum level higher than that of the first quantum well layer; and
- a second tunneling quantum well layer formed between the first and third quantum well layers, with a thickness thereof allowing carriers to pass through via tunneling.

* * * * *